(12) United States Patent
Arnold et al.

(10) Patent No.: US 8,448,103 B2
(45) Date of Patent: May 21, 2013

(54) MANUFACTURING FEATURES OF DIFFERENT DEPTH BY PLACEMENT OF VIAS

(75) Inventors: John C. Arnold, North Chatham, NY (US); Catherine Labelle, Wappingers Falls, NY (US)

(73) Assignees: International Business Machines Corporation, Armonk, NY (US); Globalfoundries, Inc., Grand Cayman (KY)

( * ) Notice: Subject to any disclaimer, the term of this patent is extended or adjusted under 35 U.S.C. 154(b) by 177 days.

(21) Appl. No.: 13/018,551

(22) Filed: Feb. 1, 2011

(65) Prior Publication Data

US 2012/0198403 A1    Aug. 2, 2012

(51) Int. Cl.
*G06F 17/50* (2006.01)

(52) U.S. Cl.
USPC .............................. 716/55; 716/119; 716/139

(58) Field of Classification Search
USPC ........................................... 716/55, 119, 139
See application file for complete search history.

(56) References Cited

U.S. PATENT DOCUMENTS 6,635,528 B2 * 10/2003 Gilbert et al. ................. 438/253
7,007,258 B2 *  2/2006 Li ................................. 716/122

OTHER PUBLICATIONS

C. Labelle et al., "Porous Low-k Material Etch for 32 nm and Beyond", 61st Annual Gaseous Electronics Conference, American Physical Society, Oct. 17, 2008, Dallas, Texas.
C. Labelle et al., "Etch Plasma Chemistry and Film Variability Effects on Dual Damascene Patterning of Porous Ultra-low k Materials", 54th AVS International Symposium and Exhibition, American Vacuum Society, Oct. 15, 2007, Seattle, Washington.

* cited by examiner

*Primary Examiner* — Thuan Do
(74) *Attorney, Agent, or Firm* — Yuanmin Cai; Ira D. Blecker

(57) ABSTRACT

A methodology for varying the depth of a design feature on a semiconductor wafer. Vias are formed according to design requirements. Nonfunctioning vias may also be placed at a location with respect to a design feature. After vias are formed, the semiconductor wafer is caused to undergo an ashing process followed by the application of an organic planarizing layer. The design features are then formed. If the depth of the design features does not meet design requirements, another semiconductor wafer may be processed to meet design requirements by varying the ashing conditions, choice of organic planarizing layer and/or the nonfunctioning and/or functioning via placement. Design features having various depths on a single semiconductor wafer may be formed with a single lithographic process.

20 Claims, 7 Drawing Sheets

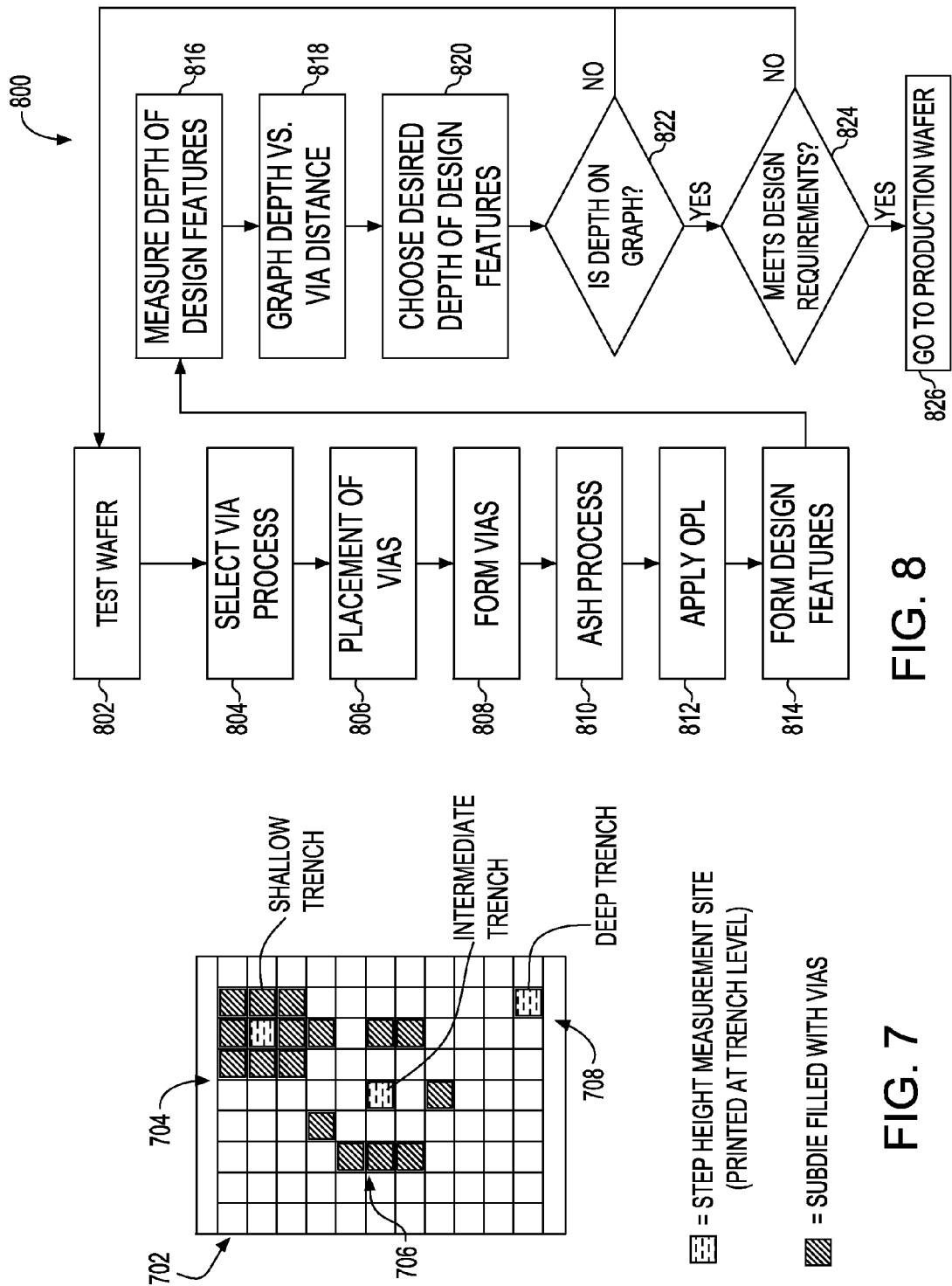

MANUFACTURING FEATURES OF DIFFERENT DEPTH BY PLACEMENT OF VIAS

BACKGROUND

The present invention pertains to forming design features such as trenches and vias in a semiconductor substrate and, more particularly, pertains to a methodology for varying the depth of the design features by the selective placement of vias and by varying ashing conditions and the organic planarizing layer.

Semiconductor devices include trenches and vias for forming and connecting various semiconductor devices. These trenches and vias should have a depth that matches the design requirements for the semiconductors being manufactured. Additionally, the trenches and vias may have different depths from device to device which makes manufacturing of these devices costly and time consuming.

BRIEF SUMMARY

The various advantages and purposes of the exemplary embodiments as described above and hereafter are achieved by providing, according to a first aspect of the exemplary embodiments, a method of varying design feature depth in a semiconductor wafer. The method includes choosing a via process for forming vias in the semiconductor wafer; selecting vias for placement with respect to a design feature, the vias being placed with respect to a location where the design feature is to be formed; forming the vias in the semiconductor wafer; causing the formed vias in the semiconductor wafer to undergo an ashing process; applying an organic planarizing layer to the semiconductor wafer; forming the design feature; measuring a depth of the design feature; documenting the depth of the design feature versus distance between design feature and vias to form a document of depth of design feature versus distance between design feature and vias; and choosing a via placement from the document that meets the design requirements for the design feature.

According to a second aspect of the invention, there is provided a method of varying design feature depth in a semiconductor wafer. The method includes selecting a test wafer; choosing a via process for forming nonfunctioning vias and functioning vias in the test wafer; selecting nonfunctioning vias for placement with respect to a design feature, the nonfunctioning vias being placed with respect to a location where the design feature is to be formed; forming the nonfunctioning and functioning vias in the test wafer; causing the formed vias in the test wafer to undergo an ashing process; applying an organic planarizing layer to the test wafer; forming the design feature; measuring a depth of the design feature; documenting the depth of the design feature versus distance between design feature and nonfunctioning vias to form a document of depth of design feature versus distance between design feature and nonfunctioning vias; and choosing a nonfunctioning via placement from the document that meets the design requirements for the design feature.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 7 illustrates that multiple trench depths can be achieved with a single lithographic process.

FIG. 8 is a flow chart illustrating the methodology of the exemplary embodiments.

DETAILED DESCRIPTION

Figure 1:
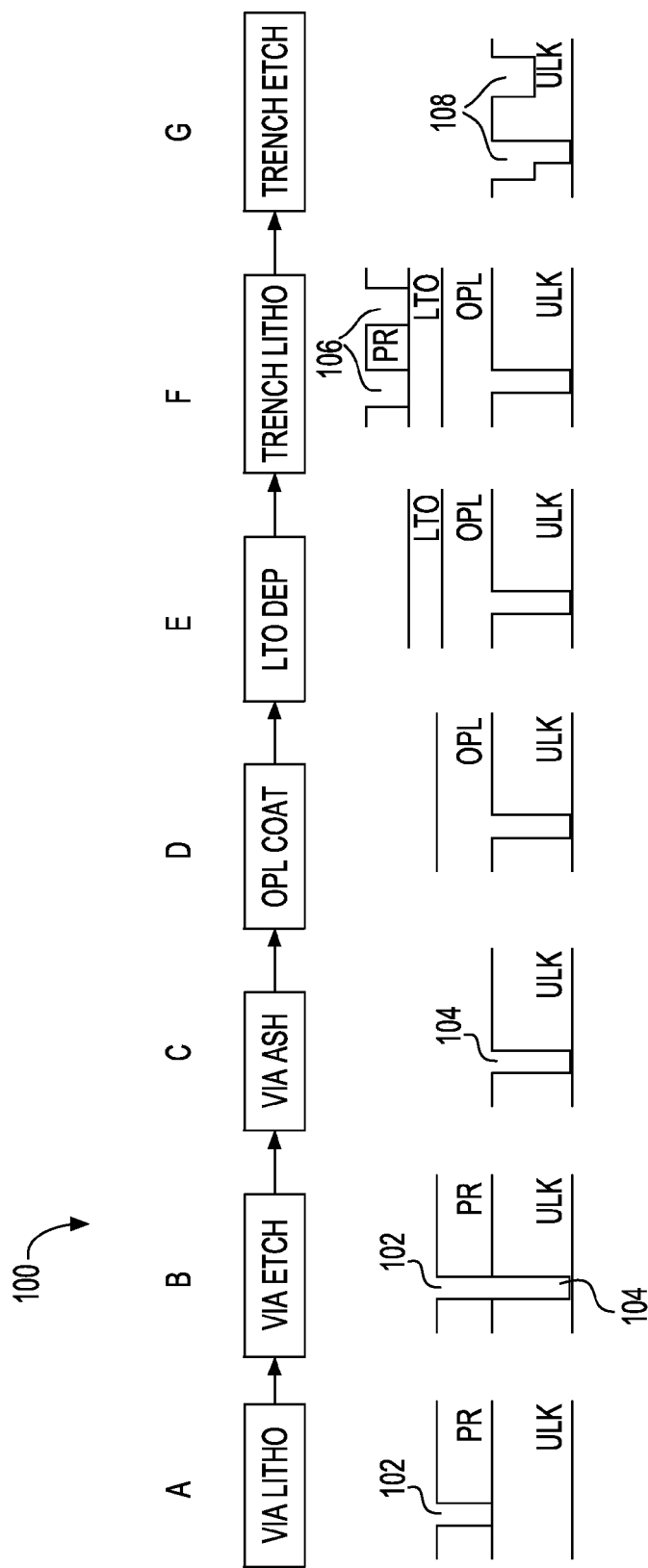
FIG. 1 is an exemplary process flow for forming trenches and vias in a semiconductor substrate.

Referring to FIG. 1, there is shown an exemplary process flow 100 for forming vias and trenches on a semiconductor substrate. In step A, a semiconductor wafer having an insulating layer such as an ultra low dielectric (ULK) material is patterned with a photoresist. The ULK utilized was a porous SiCOH (silicon-carbon-oxygen-hydrogen) ULK film deposited by a plasma enhanced physical vapor deposition process (PECVD) using diethoxymethysilane (DEMS) and bicycloheptadiene (BCHD) as precursors. The ULK film had a dielectric constant k of 2.4. Other porous dielectric materials may also be possible for use in the exemplary embodiments. The opening 102 in the photoresist (PR) is where a via will be formed. In step B, the via 104 is etched through the opening 102 in the ULK material using a dry etch such as reactive ion etching. Thereafter, the photoresist is conventionally stripped and then the semiconductor structure undergoes an ashing step to remove any residual photoresist in step C. In step D, an organic planarizing layer (OPL) is formed followed by the formation of a low temperature oxide (LTO) in step E. Next, in step F, the semiconductor structure is lithographically patterned using a photoresist (PR) to form openings 106. Finally, in step G, trenches 108 are conventionally etched by a process such as reactive ion etching followed by removal of the photoresist, low temperature oxide and organic planarizing layer.

The present inventors have discovered that the depth of the trench in step G varies depending on the processing conditions that have occurred prior to the trench etch process step. More specifically, the process conditions for via ash and type of organic planarizing layer may have an effect on the depth of the trench that is subsequently formed.

Figure 2:
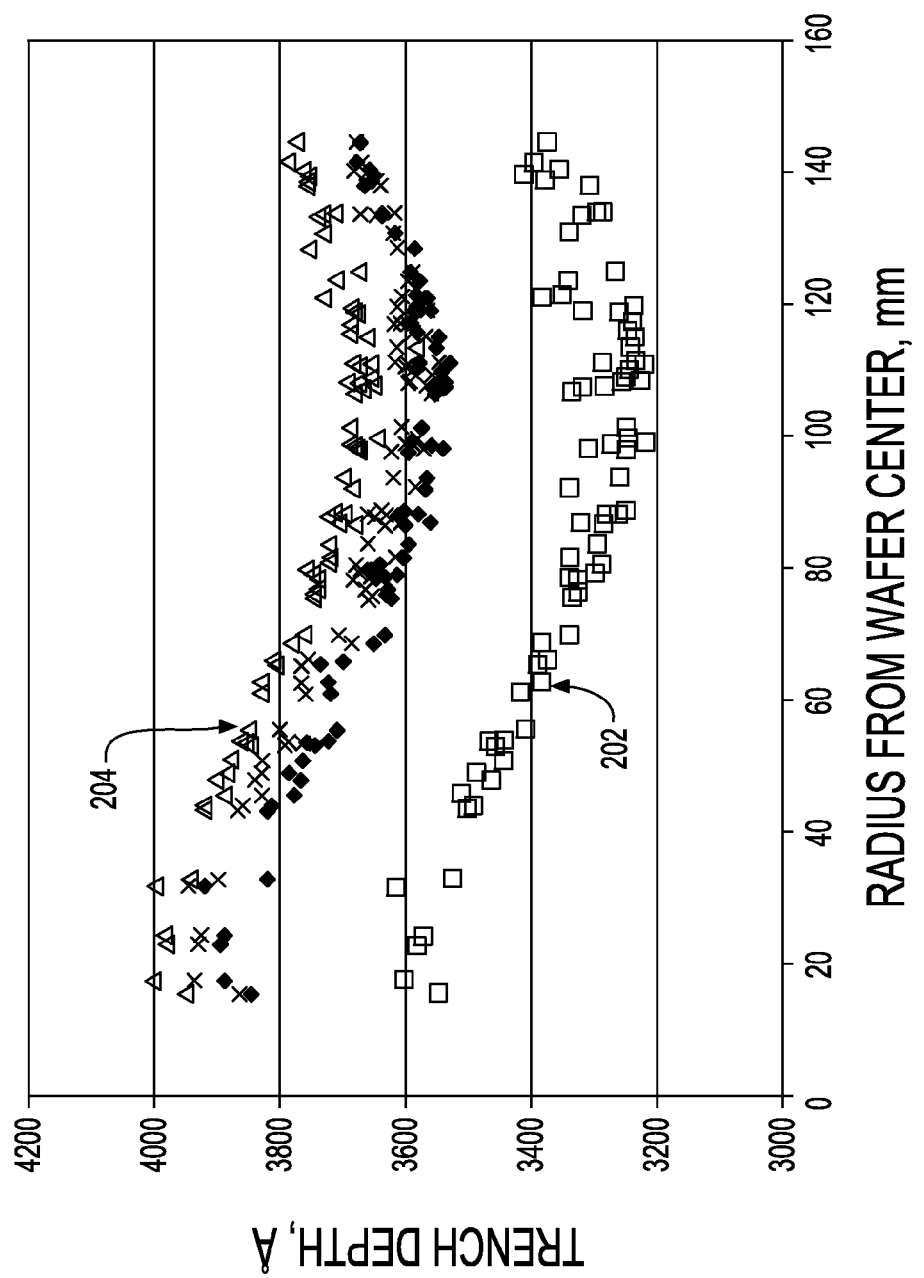
FIG. 2 illustrates the effect of ashing conditions on trench depth.

Referring now to FIG. 2, the effect of ashing conditions on trench depth will be discussed. Several wafers containing the same semiconductor structures were subjected to different ashing processes. It was found that the subsequent trench depth was shallower for milder ashing processes (indicated as 202, a mild $CO_2$ ash), and deeper for harsher ashing processes (indicated by 204, an $NH_3/O_2$ ash). The conditions used in this experiment were chosen from the set commonly used in the industry for processing ULK dielectrics, and were based on gases such as NH3, O2, and CO2. In general, less damaging ashing conditions result in shallower trenches.

Figure 3:
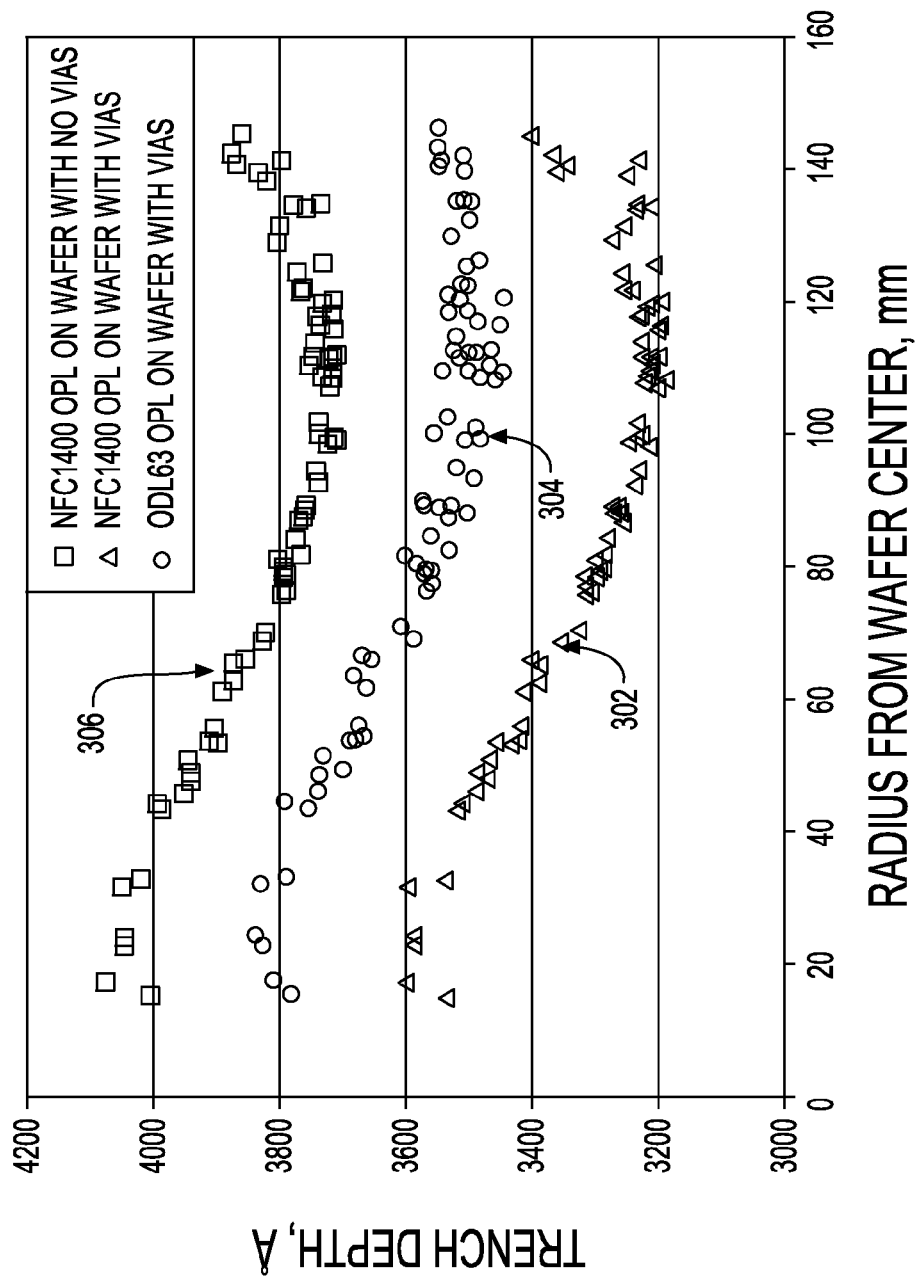
FIG. 3 illustrates the effect of the type of organic planarizing layer on trench depth.

The type of organic planarizing material may also have an effect on trench depth. Experiments were run using an organic planarizing layer material after an ashing step to determine the effect on trench depth. As a control, one wafer had an NFC 1400 (available from Japan Synthetic Rubber) organic planarizing layer applied without there being any vias while a second wafer had an NFC 1400 organic planarizing layer applied with vias. A third wafer had an ODL63 (available from Shinetsu) organic planarizing layer applied with vias. The results are plotted in FIG. 3. As shown in FIG. 3, the wafer having the NFC 1400 organic planarizing material and vias markedly reduced the trench depth (302 in FIG. 3) compared to the wafer having the NFC 1400 organic planarizing material without vias (306 in FIG. 3). The wafer having the ODL63 organic planarizing layer with vias also reduced the trench depth (304 in FIG. 3) although not as much as the wafer having the NFC 1400 organic planarizing layer having vias. Other organic planarizing materials known to a person skilled in the art may have a greater or lesser effect on trench depth as can be readily determined with minimal experimentation within the skill of a person skilled in the art. The extent of trench depth reduction is thus a function of both ashing conditions and OPL material.

Figure 4:
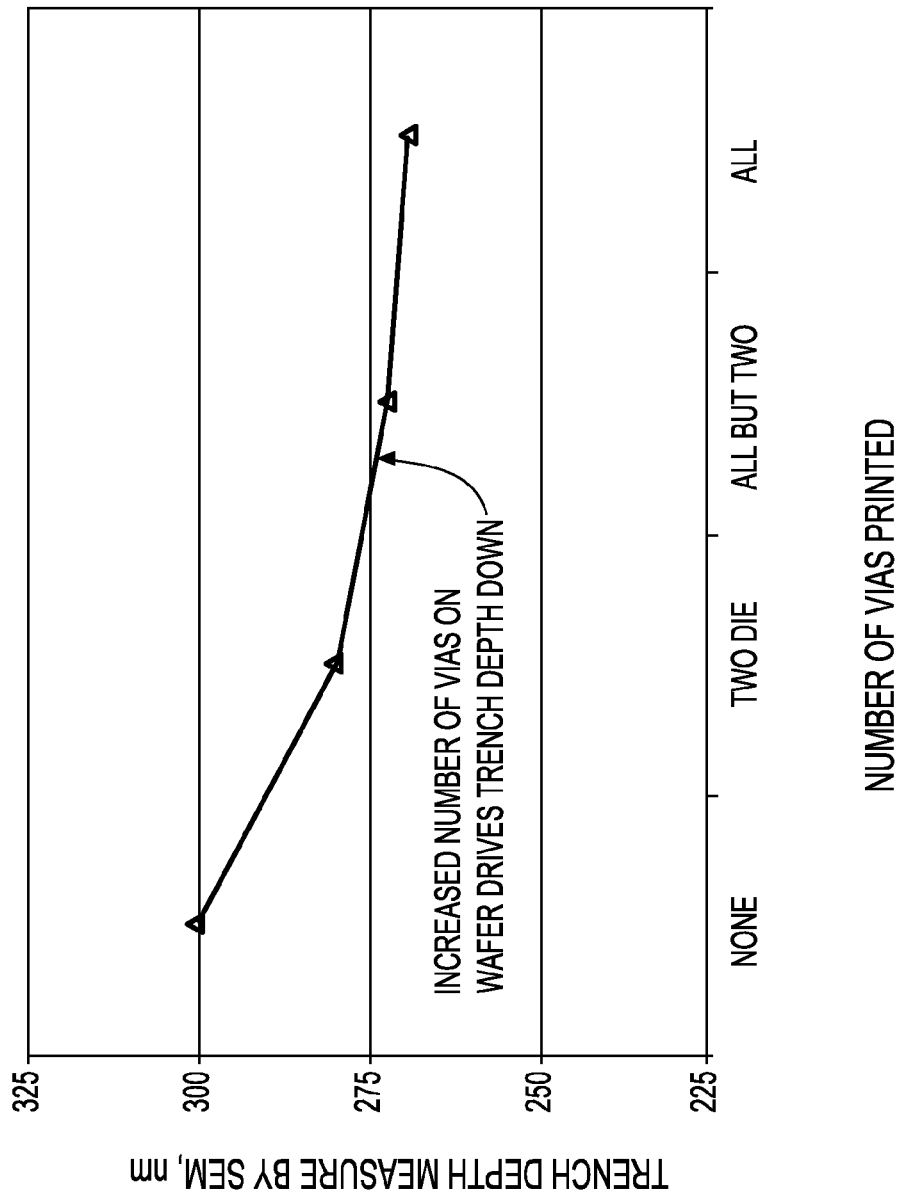
FIG. 4 illustrates the effect of the number of vias on trench depth.

In addition, the present inventors have discovered that the placement of vias in proximity to the trench that is to be etched can also affect the trench depth. In fact, it has been found that the ashing conditions and the type of organic planarizing layer may have no effect on trench depth if there are no vias near the trench. To illustrate this point, wafer samples were fabricated in which the number of vias on the wafer is varied. As shown in FIG. 4, trench depth decreases with increasing numbers of vias. Where there was no vias, trench depth was unaffected.

Figure 5:
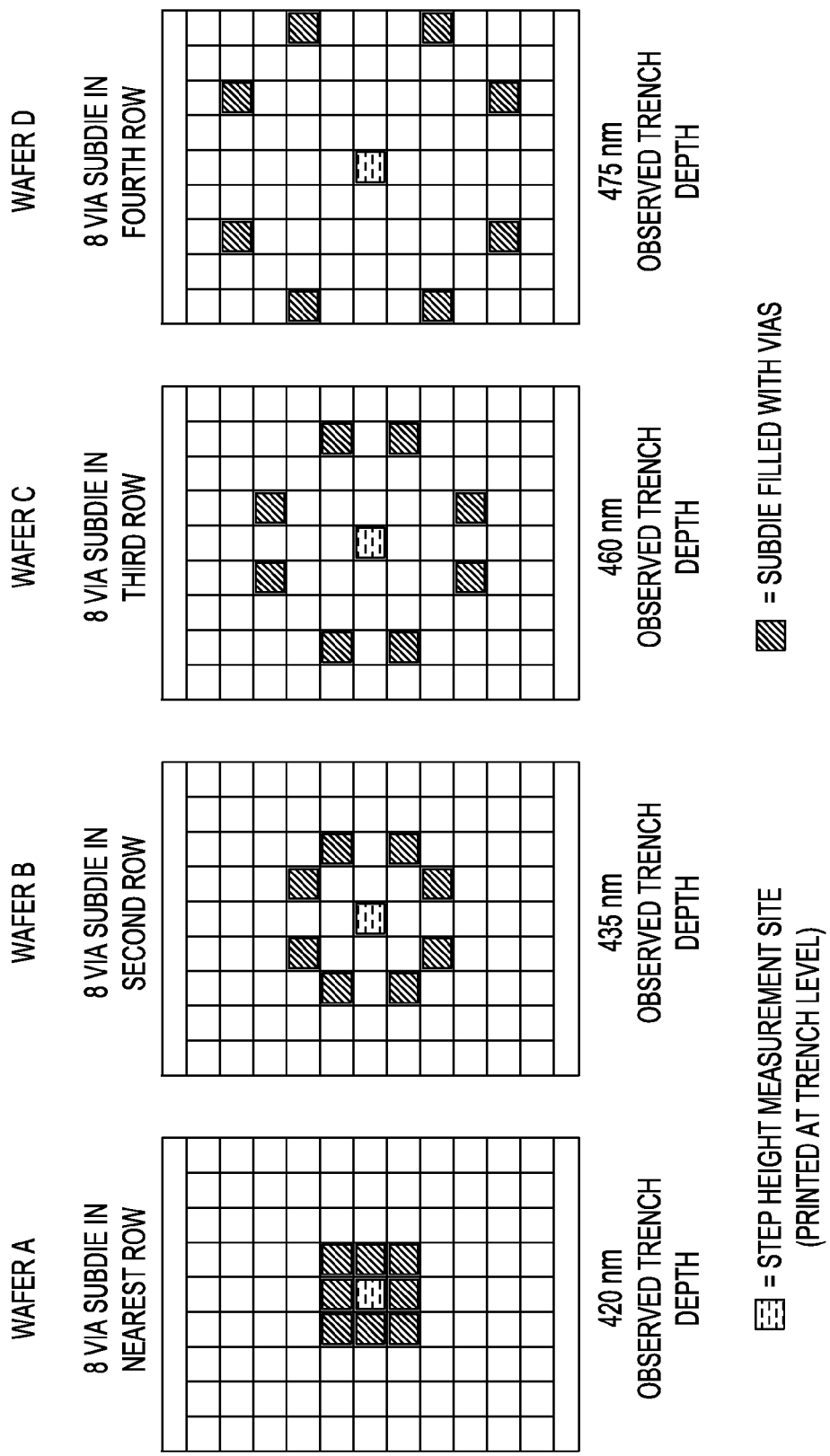
FIG. 5 illustrates four different wafer samples to demonstrate the effect of placement of vias on trench depth.

Further wafer samples were prepared to determine the effect of the placement of vias on trench depth. Die on semiconductor wafers were divided into 2 mm square subdie grid areas. In one of these subdie areas, trenches were formed. In eight of the other subdie, vias were formed with an areal density typical of current circuit designs, in the range of 0.1% to 5% open area. That is, the vias occupy about 0.1% to 5% of the surface area of the subdie. The subdie with the vias were placed at varying distances from the subdie with the trenches. That is, the subdie with the vias were placed right next to the subdie with the trenches (wafer A), one subdie row apart from the subdie with the trenches (wafer B), two subdie rows apart from the subdie with the trenches (wafer C) or three subdie rows apart from the subdie with the trenches (wafer D). With the foregoing geometry, the vias are about 3 mm from the trench in wafer A, about 6 mm from the trench in Wafer B, about 8 mm from the trench in wafer C and about 12 mm from the trench in wafer D. Wafers A, B, C and D are shown in FIG. 5.

Figure 6:
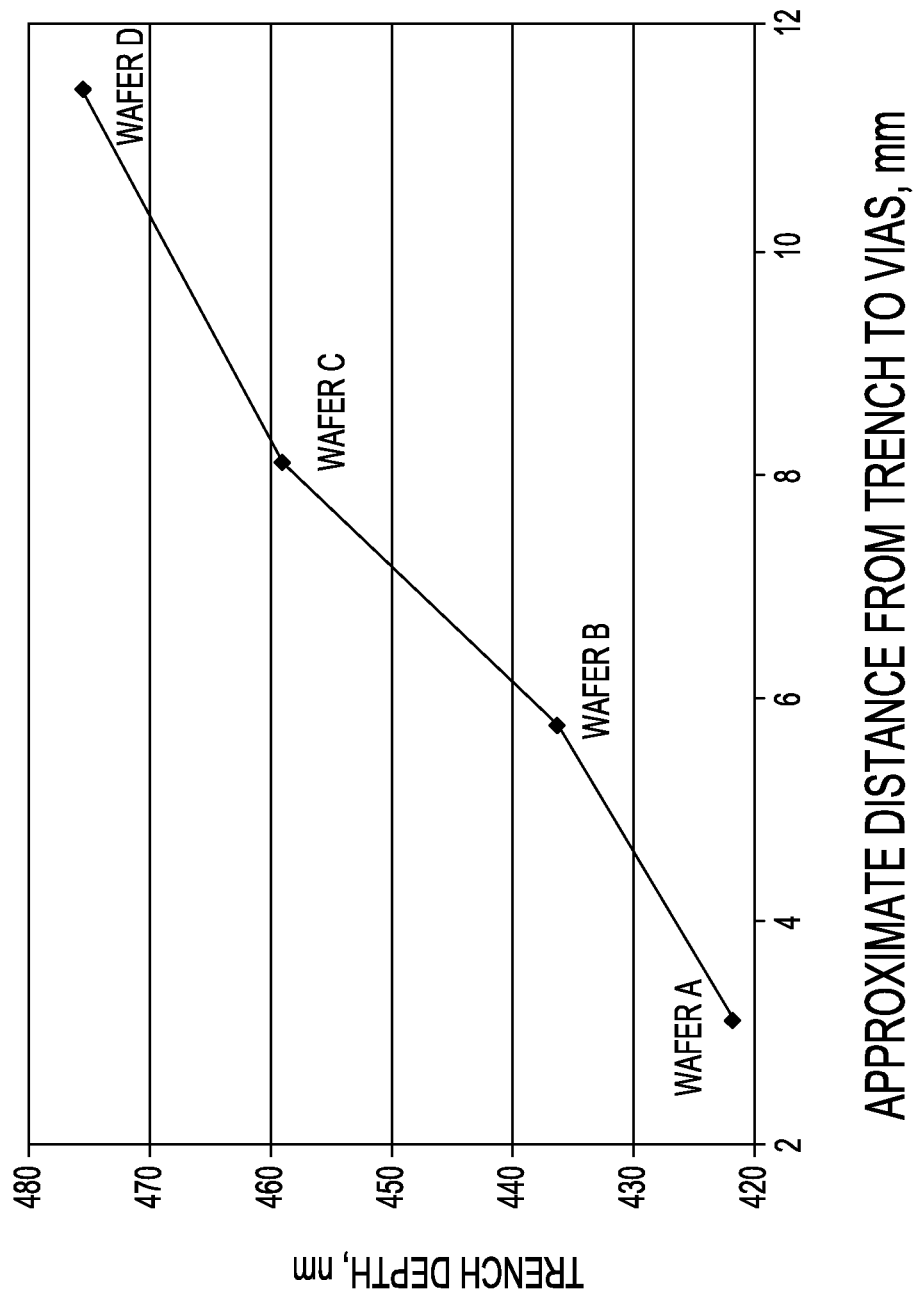
FIG. 6 is a graph illustrating that trench depth increases as the distance to the vias increases.

Wafers A, B, C and D were processed according to the process flow in FIG. 1. After processing, trench depth was measured and indicated on FIG. 5 for each test wafer. Thus, the trenches on wafer A had a trench depth of about 420 nm (nanometers), the trenches on wafer B had a trench depth of about 435 nm, the trenches on wafer C had a trench depth of about 460 nm and the trenches on wafer D had a trench depth of about 475 nm. The trench depth was plotted versus the approximate distance to the vias on a graph as shown in FIG. 6 where the relationship between the via distance and trench depth can be easily seen. The trench depth increases as the distance to the vias increases. Any means of documenting the relationship between the via distance and trench depth may be utilized. Such documenting means may include the aforementioned graph in FIG. 6 but may also include documenting means such as tables and charts.

Referring to FIG. 7, it is shown that multiple trench depths can be accommodated on the same die using the same lithographic process. FIG. 7 shows a portion 702 of a die. One part 704 of the die may have vias closely spaced to the trench to result in a shallow trench. Or, the vias may be spaced from the trench by a predetermined distance (approximately 5 mm in the case of part 706) to result in an intermediate depth trench as shown in part 706 of the die. Lastly, there may be no vias in the vicinity of the trench, as shown in part 708, to result in the deepest trench. In a similar manner, different die on the same semiconductor wafer may have different trench depths using the same lithographic process.

Thus, if the design of a given device requires trenches with different depths, trench depth control may be accomplished by following the exemplary embodiments of the present invention. That is, by varying the ashing conditions, changing the type of organic planarizing layer and/or the number and location of the vias, different depth trenches may be obtained for one device or a multiple of devices during a single lithographic process of patterning, exposing and etching the entire semiconductor wafer. This is potentially less expensive and more reliable than the conventional method, which would require separate lithographic and etching processes for each desired trench depth.

A methodology for practicing the exemplary embodiments is illustrated in FIG. 8. One or more semiconductor test wafers is obtained in block 802. The test wafer should at least have one dielectric layer. In a preferred exemplary embodiment, the dielectric layer is an ultralow dielectric constant layer. In general, the dielectric layer should be porous. The semiconductor test wafer may be processed according to the test flow in FIG. 1.

A process to form the vias is selected, block 804. In this step, the process to form the vias may be varied as required to meet the manufacturability and design requirements of the die. The process variables include pressures, gases, ashing conditions, etc.

Placement of vias is then done to adjust the depth of the design features, which for the purpose of FIG. 8 is a trench but in other embodiments is a via, as required, block 806. Placement of vias includes the spacing of the vias for the design features as well as choosing the number of vias which may also affect trench depth as indicated in FIG. 4.

Vias are then formed, block 808. The vias used for trench depth control may also serve as electrical pathways (functioning vias) between metal layers, as is conventional, or they may be non-electrical structures introduced simply for controlling the depth of nearby trenches and perform no electric function (nonfunctioning vias). Nonfunctioning vias may be formed at selected locations on the test wafer at predetermined distances from the trench design feature which will be added later. Vias that are part of the electrical design of the die may also be formed according to design requirements. In an exemplary embodiment, only functioning vias are used for trench depth control.

The vias then undergo an ashing process, block 810. The ashing process may be varied as indicated above in FIG. 2.

An organic planarizing layer is applied to the test wafer, block 812. The organic planarizing material is selected so as to provide a desired degree of trench depth modulation as indicated above in FIG. 3.

In selecting the combination of ashing conditions and OPL material, one must take into account both the degree of trench depth modulation required and whatever constraints the circuit design may impose on via placement. For example, if the desired trench depth modulation is low and/or the space available for via placement is particularly close to the trenches, then an ash/OPL combination with low impact may be appropriate. Conversely, if the required trench depth modulation is high and/or the space available for via placement is relatively far from the trenches, then an ash/OPL combination with strong impact is favored.

The trenches are then formed, block 814. All of the trenches may be formed at the same time using a single lithographic process (including patterning and exposing a photoresist and etching) which reduces cost and enhances the semiconductor fabrication process.

The depths of the trenches are measured, block 816. Once the depths of the trenches are obtained, the depths of the trenches may be graphed, block 818, against the distance of the vias from the trenches to obtain a graph similar to the one shown in FIG. 6. This graph may be used to choose the process conditions to result in a desired trench depth. For example, assume that a wafer was processed as described in the methodology of FIG. 8 to result in the graph shown in FIG. 6. Further assume that a trench depth of about 450 nm is desired. From FIG. 6, it can be seen that a trench depth of 450 nm can be obtained with a via distance of about 7 mm. Again, while a graph may be used in an exemplary embodiment, other forms of documenting such as tables or charts may also be used.

The desired depth of trench for a given location on the die is next chosen, block 820. The graph obtained in block 818 is referenced to obtain the required spacing of vias from the trench. A determination must now be made, block 822. If the desired trench depth is on the graph, the process may proceed to the next step. If the desired trench depth is not on the graph, the process may return to block 802 and do another test wafer and vary the via ashing process conditions, choice of OPL material, and/or via placement to result in a better fit with the desired trench depth.

It is next determined, block 824, if the test wafer including trench depth and via placement meets the design requirements for the die. If it does meet the design requirements, production wafers and die may be made according to the process conditions utilized in the methodology of FIG. 8, block 826. If the design requirements are not met, the process returns to block 802 to do another test wafer and start the process over.

The preceding discussion has focused on the use of vias (functioning and/or nonfunctioning) to control the trench depth. It should be understood that the present invention may have applicability to controlling via depth as well as trench depth. It should also be understood that while vias (functioning and/or nonfunctioning) have been utilized to control trench depth, it is also within the scope of the present invention to have trenches (functioning and/or nonfunctioning) control the depth of functioning trenches or vias.

i. It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of varying design feature depth in a semiconductor wafer comprising:
   choosing a via process for forming vias in the semiconductor wafer;
   selecting vias for placement with respect to a design feature, the vias being placed with respect to a location where the design feature is to be formed, wherein the design feature is a trench or via having a controlled depth in the semiconductor wafer when the design feature is formed;
   forming the vias in the semiconductor wafer;
   causing the formed vias in the semiconductor wafer to undergo an ashing process;
   applying an organic planarizing layer to the semiconductor wafer;
   forming the design feature having the controlled depth;
   measuring a depth of the design feature;
   documenting the depth of the design feature versus distance between design feature and vias to form a document of depth of design feature versus distance between design feature and vias; and
   choosing a via placement from the document that meets the design requirements for the design feature.

2. The method of claim 1 wherein the semiconductor wafer is a test wafer.

3. The method of claim 1 wherein if there is no available via placement that meets the design requirements for the design feature, then starting the method again by choosing a via process and repeating all method steps.

4. The method of claim 3 wherein repeating all method steps includes varying the ashing conditions.

5. The method of claim 3 wherein applying an organic planarizing layer includes changing the organic planarizing layer.

6. The method of claim 3 wherein selecting vias for placement with respect to a design feature includes selecting a number of vias and a distance between the vias and the design feature.

7. The method of claim 1 wherein if there is a via placement that meets the design requirements for the design feature, then further comprising manufacturing a production semiconductor wafer.

8. The method of claim 1 wherein choosing a via process includes choosing an ashing process.

9. The method of claim 1 wherein selecting vias for placement with respect to a design feature includes selecting a number of vias and a distance between the vias and the design feature.

10. The method of claim 1 wherein the vias comprise a mixture of functioning vias and nonfunctioning vias.

11. The method of claim 10 wherein the functioning vias serve as electrical pathways for metal layers in a semiconductor wafer and the nonfunctioning vias perform no electrical function.

12. A method of varying design feature depth in a semiconductor wafer comprising:
    selecting a test wafer;
    choosing a via process for forming nonfunctioning vias and functioning vias in the test wafer;
    selecting nonfunctioning vias for placement with respect to a design feature, the nonfunctioning vias being placed with respect to a location where the design feature is to be formed, wherein the design feature is a trench or via having a controlled depth in the semiconductor wafer when the design feature is formed;
    forming the nonfunctioning and functioning vias in the test wafer;
    causing the formed vias in the test wafer to undergo an ashing process;
    applying an organic planarizing layer to the test wafer;
    forming the design feature having the controlled depth;
    measuring a depth of the design feature;
    documenting the depth of the design feature versus distance between design feature and nonfunctioning vias to form a document of depth of design feature versus distance between design feature and nonfunctioning vias; and choosing a nonfunctioning via placement from the document that meets the design requirements for the design feature.

13. The method of claim 12 wherein if there is no nonfunctioning via placement that meets the design requirements for the design feature, then starting the method again by selecting a wafer and repeating all steps of the method.

14. The method of claim 13 wherein repeating all steps of the method includes varying the ashing conditions.

15. The method of claim 13 wherein applying an organic planarizing layer includes changing the organic planarizing layer.

16. The method of claim 13 wherein selecting nonfunctioning vias for placement with respect to a design feature includes selecting a number of nonfunctioning vias and a distance between the nonfunctioning vias and the design feature.

17. The method of claim 12 wherein if there is a nonfunctioning via placement that meets the design requirements for the design feature, then further comprising manufacturing a production semiconductor wafer.

18. The method of claim 12 wherein choosing a via process includes choosing an ashing process.

19. The method of claim 12 wherein selecting nonfunctioning vias for placement with respect to a design feature includes selecting a number of nonfunctioning vias and a distance between the nonfunctioning vias and the design feature.

20. The method of claim 12 wherein the functioning vias serve as electrical pathways for metal layers in a semiconductor wafer and the nonfunctioning vias perform no electrical function.

\* \* \* \* \*